(12) United States Patent
Chung-Chieh et al.

(10) Patent No.: US 9,547,734 B2
(45) Date of Patent: Jan. 17, 2017

(54) ARRAY MODELING FOR ONE OR MORE ANALOG DEVICES

(75) Inventors: Yang Chung-Chieh, Hsin-Chu (TW); Chih-Chiang Chang, Taipei (TW); Chung-Ting Lu, Kaohsiung (TW)

(73) Assignee: Taiwan Semiconductor Manufacturing Company Limited, Hsin-Chu (TW)

( * ) Notice: Subject to any disclaimer, the term of this patent is extended or adjusted under 35 U.S.C. 154(b) by 713 days.

(21) Appl. No.: 13/596,214

(22) Filed: Aug. 28, 2012

(65) Prior Publication Data
US 2014/0067348 A1  Mar. 6, 2014

(51) Int. Cl.
*G06F 17/50* (2006.01)

(52) U.S. Cl.
CPC ....... *G06F 17/5036* (2013.01); *G06F 17/5063* (2013.01); *G06F 17/5068* (2013.01)

(58) Field of Classification Search
CPC .............. G06F 17/5036; G06F 17/5045; G06F 17/5072; G06F 17/5063; G06F 17/505
USPC ...... 703/14, 13, 4, 3; 716/52, 119, 116, 118, 716/139
See application file for complete search history.

(56) References Cited

U.S. PATENT DOCUMENTS

| | | | |
|---|---|---|---|
| 6,978,229 B1 * | 12/2005 | Saxena | G06F 17/5036 257/E21.525 |
| 8,479,126 B1 * | 7/2013 | Liu | G06F 17/5036 703/14 |
| 2009/0213558 A1 * | 8/2009 | Osaka et al. | 361/748 |
| 2010/0250187 A1 * | 9/2010 | Zuber | G06F 17/5036 702/179 |

OTHER PUBLICATIONS

Conti, Massimo et al., "An Integrated CAD Methodology for Yield Enhancement of VLSI CMOS Circuits Including Statistical Device Variations", 2003, Analog Integrated Circuits and Signal Processing, 37, Kluwer Academic Publishers.*
Stine, Brian E. et al., "Analysis and Decomposition of Spatial Variation in Integrated Circuit Processes and Devices", Feb. 1997, IEEE Transactions on Semiconductor Manufacturing, vol. 10, No. 1, IEEE.*
Saxena, Sharad et al., Variation in Transistor Performance and Leakage in Nanometer-Scale Technologies, Jan. 2008, IEEE Transactions on Electron Devices, vol. 55, No. 1, IEEE.*
Natarajan, Suriyaprakash et al., "Process Variations and Their Impact on Circuit Operation", 1998, IEEE International Symposium, IEEE.*

* cited by examiner

*Primary Examiner* — Cedric D Johnson
(74) *Attorney, Agent, or Firm* — Cooper Legal Group, LLC (57) ABSTRACT

Among other things, one or more techniques for creating an array model for analog device modeling are provided. In an embodiment, the array model represents a mean value or a standard deviation value of an analog device characteristic for an analog device based on a physical location of the analog device within a circuit layout, where the physical location is identified using a physical set of coordinates. The physical set of coordinates maps to an array set of coordinates of the array model. In this manner, a mean value and a standard deviation value are obtainable from the array model using the array set of coordinates. The mean value and the standard deviation value are usable to model the analog device, and thus a circuit within which the analog device is used, to obtain a more accurate or realistic prediction of operation or behavior, for example.

20 Claims, 9 Drawing Sheets

ARRAY MODELING FOR ONE OR MORE ANALOG DEVICES

BACKGROUND

Generally, a circuit comprises one or more circuit elements. In an example, a circuit element of the one or more circuit elements is an analog device, such as a resistor, capacitor, metal oxide semiconductor field effect transistor (MOSFET), thin-fin field effect transistor (FinFET), bipolar junction transistor (BJT), diode, varactor, etc. An analog device is generally associated with an analog device characteristic that is affected by various types of variation. However, this variation is unaccounted for in traditional models. Thus, simulations based on a traditional model are not sufficiently accurate.

SUMMARY

This summary is provided to introduce a selection of concepts in a simplified form that are further described below in the detailed description. This summary is not intended to be an extensive overview of the claimed subject matter, identify key factors or essential features of the claimed subject matter, nor is it intended to be used to limit the scope of the claimed subject matter.

Among other things, one or more techniques for creating an array model for analog device modeling, for associating an array model with a circuit element of a schematic simulation, and for creating a netlist for an array model are provided herein. For example, an array model is created to represent an analog device characteristic for an analog device based on a physical location of the analog device. In an embodiment, the array model characterizes the analog device characteristic using a mean value and a standard deviation value according to the physical location of the analog device within a circuit layout.

The following description and annexed drawings set forth certain illustrative aspects and implementations. These are indicative of but a few of the various ways in which one or more aspects are employed. Other aspects, advantages, or novel features of the disclosure will become apparent from the following detailed description when considered in conjunction with the annexed drawings.

DESCRIPTION OF THE DRAWINGS

Aspects of the disclosure are understood from the following detailed description when read with the accompanying drawings. It will be appreciated that elements, structures, etc. of the drawings are not necessarily drawn to scale. Accordingly, the dimensions of the same may be arbitrarily increased or reduced for clarity of discussion, for example.

DETAILED DESCRIPTION

The claimed subject matter is now described with reference to the drawings, wherein like reference numerals are generally used to refer to like elements throughout. In the following description, for purposes of explanation, numerous specific details are set forth in order to provide a thorough understanding of the claimed subject matter. It is evident, however, that the claimed subject matter may be practiced without these specific details. In other instances, structures and devices are illustrated in block diagram form in order to facilitate describing the claimed subject matter.

Generally, a circuit comprises one or more circuit elements, where one or more of the circuit elements comprise an analog device, such as a resistor, a capacitor, a transistor, etc. respectively having one or more analog device characteristics. It is generally advantageous to simulate a circuit in a simulation environment to model the behavior of the circuit, such as the interaction of different analog devices with one another within the circuit, for example. However, the behavior of an analog device in the real world is often different than an expected or theoretical behavior of the analog device. For example, a resistor that is, in theory, supposed to have a resistance of 1 kOhm, may, in reality, have a resistance of 0.9 kOhms. Accordingly, to more accurately model the behavior of an analog device in a simulation environment, and thus the overall behavior of a circuit comprising the analog device, it is desirable to use a device characteristic more reflective of the real world behavior of the analog device, rather than a theoretical characteristic of the analog device. It will be appreciated that an analog device characteristic comprises a variety of possible characteristics. For example, in an embodiment, the analog device characteristic is at least one of a resistance, a capacitance, an inductance, a transconductance, a conductance, a diode model, a current source, a voltage source, a metal oxide semiconductor field effect transistor (MOSFET) characteristic, a field effect transistor (FET) characteristic, a fin field effect transistor (FinFET) characteristic, a bipolar junction transistor (BJT) characteristic, a varactor characteristic, a diode characteristic, etc. Often, an analog device characteristic for an analog device varies based upon a location of the analog device within a circuit layout, or rather where the analog device is physically located when created in the real world. For example, an analog device located at or near a center of a circuit layout generally comprises an analog device characteristic that is closer to a theoretical analog device characteristic for the analog device, whereas an analog device located at or near an edge of the circuit layout generally comprises an analog device characteristic that is further away from the theoretical analog device characteristic for the analog device. For example, a device characteristic of an analog device is a function of a gradient effect, an edge variation, or other location based effects that generally worsen as a device is formed closer to an edge of a circuit layout and away from a center of the circuit layout.

Accordingly, as provided herein, variations in an analog characteristic for an analog device, particularly as relates to a location of the analog device in a circuit layout, are addressed by using an array model that considers at least one of a mean and a standard deviation of the analog device characteristic as a function of the location of the analog device. In an embodiment, the array model comprises a mean array and a standard deviation array. The array model represents the analog device characteristic across multiple physical locations such that an array set of coordinates of the array model corresponds to a physical set of coordinates for the analog device, where the physical set of coordinates corresponds to the physical location of the analog device within a circuit layout. In this manner, a physical location of the analog device, as identified by a physical set of coordinates, is mapped to the array model, using the array set of coordinates. Mapping the physical location of the analog device to a corresponding location on the array model allows the analog device, and thus a circuit comprising the analog device, to be more accurately modeled at least because the array model considers a mean and a standard deviation for the analog device at that physical location.

Figure 1:
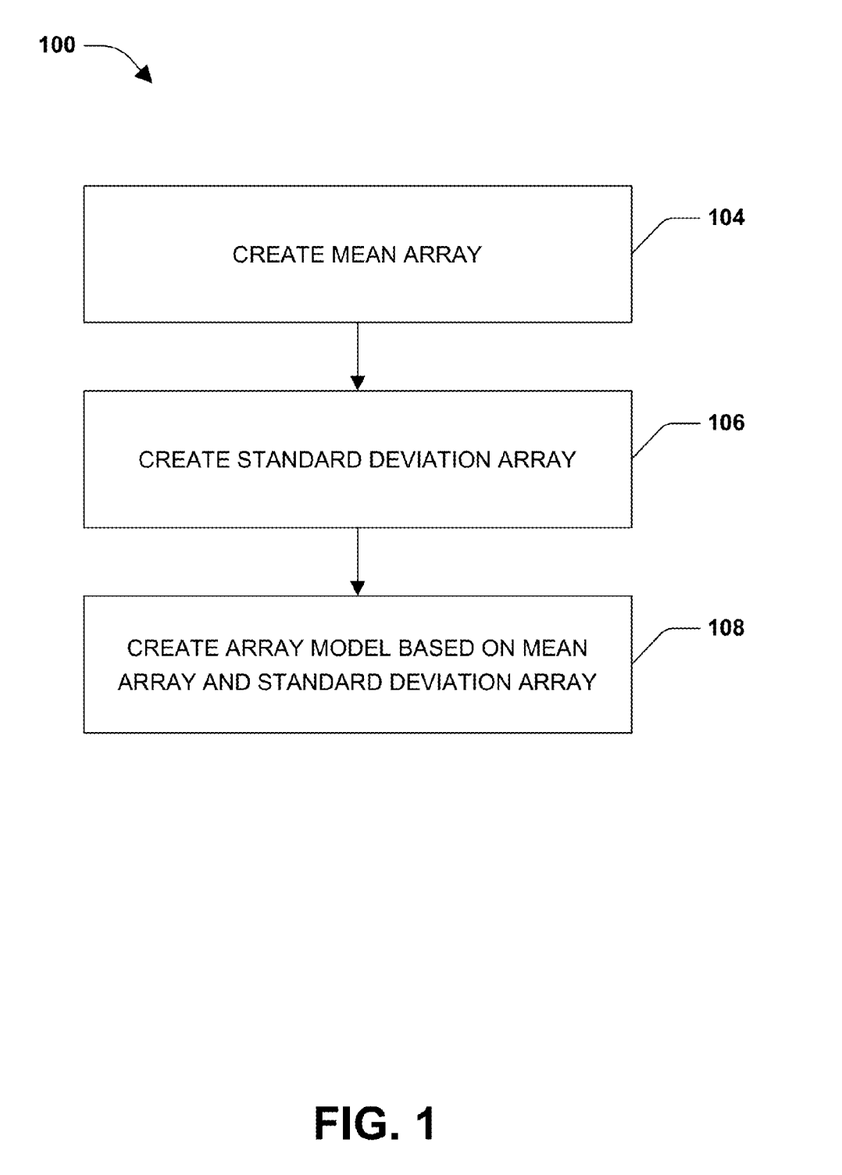
FIG. 1 is a flow diagram of an example method for creating an array model for analog device modeling, according to an embodiment.

FIG. 1 is a flow diagram of an example method 100 for creating an array model for analog device modeling, according to an embodiment. At 104, a mean array comprising one or more mean elements is created. In an embodiment, a mean element of the mean array is associated with an array set of coordinates within the array model. For example, the mean element is associated with i and j coordinates, as the array set of coordinates, within the array model. In an embodiment, the mean element at the array set of coordinates comprises a mean value indicative of a mean of an analog device characteristic for one or more analog devices at a physical location corresponding to the array set of coordinates. In an embodiment, the physical location of the one or more analog devices has a physical set of coordinates that maps to or corresponds to the array set of coordinates. In an embodiment, the physical location corresponds to a location of the one or more analog devices within a circuit layout. In this manner, mapping the physical set of coordinates to the array set of coordinates allows the physical location of the one or more analog devices within the circuit layout to be considered as that location associated with variations in the analog device characteristic. The array model further comprises a standard deviation array that further allows variations in the analog device characteristic to be considered as a function of the physical location of the one or more analog devices within the circuit layout. Accordingly, at 106, a standard deviation array comprising one or more standard deviation elements is created. In an embodiment, a standard deviation element of the one or more standard deviation elements of the standard deviation array is associated with the array set of coordinates within the array model. In an embodiment, the standard deviation element comprises a standard deviation value indicative of a standard deviation of the analog device characteristic for the one or more analog devices at the physical set of coordinates. At 108, the array model is created based on the mean array and the standard deviation array.

As an example, the analog device of FIG. 1 is a resistor having a theoretical analog device characteristic resistance value of 1 kOhm. In an embodiment, multiple example resistors fabricated at a first physical location in a circuit layout are measured and a first mean resistance value of 0.9 kOhm is determined, for example. In other words, one or more real world values associated with the first physical location are measured to determine a mean value or a standard deviation value for the array model. In an embodiment, multiple example resistors fabricated at a second physical location in the circuit layout are measured and a second mean resistance value of 1.1 kOhm is determined for those resistors at that second physical location, for example. Therefore, the real world mean value for the resistor at the first location is 0.9 kOhm, the real world mean value for the resistor at the second location is 1.1 kOhm, rather than the theoretical value of 1 kOhm. Accordingly, a mean array is created comprising at least a first mean element and a second mean element having mean values of 0.9 kOhm and 1.1 kOhm, respectively, for example. The first mean element is associated with a first array set of coordinates corresponding to the first physical location, and the second mean element is associated with a second array set of coordinates corresponding to the second physical location. In an embodiment, the first physical location is associated with a first physical set of coordinates mapped to the first array set of coordinates and the second physical location is associated with a second physical set of coordinates mapped to the second array set of coordinates. A standard deviation array is able to be developed in a similar manner. The standard deviation array comprises at least a first standard deviation element having a first standard deviation value associated with the first array set of coordinates corresponding to the first physical location. The standard deviation array also comprises a second standard deviation element having a second standard deviation value associated with the second array set of coordinates corresponding to the second physical location.

Figure 2:
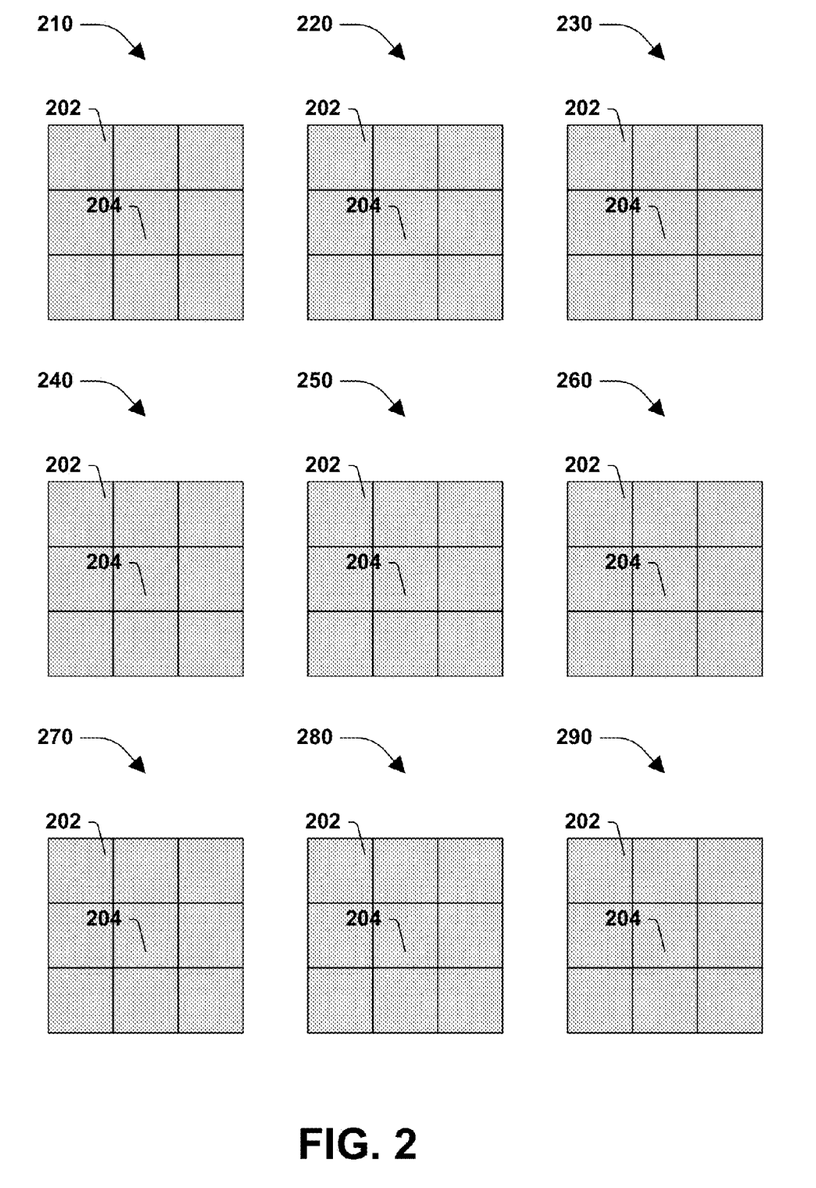
FIG. 2 is an illustration of example circuit layouts, according to an embodiment.

FIG. 2 is an illustration of example circuit layouts 210, 220, 230, 240, 250, 260, 270, 280, and 290, according to an embodiment. Although nine different layouts, respectively having nine squares, are illustrated, this number is merely an example. Accordingly, the instant application, including the scope of the appended claims, is not to be limited by this example number, as a number other than nine is contemplated. Respective circuit layouts 210-290 comprise a first physical location 202 and a second physical location 204. In this example, the first physical location 202 is at an edge of respective layouts 210-290 and the second physical location 204 is at a center of the respective layouts 210-290. In an example, a resistor at the first physical location 202 in respective layouts 210-290 has a theoretical analog device characteristic resistance value of 1 kOhm. It will be appreciated that, in practice, the resistor will exhibit slight fluctuations in resistance values across the different layouts 210-290 at least due to non-idealities, for example. Accordingly, a mean value for the analog device characteristic of resistance is calculated for the resistor at the first physical location 202 based upon the different resistance values at the first physical location 202 across the different layouts 210-290. In an embodiment, the first physical location 202 is mapped to a first physical set of coordinates and a first array set of coordinates, where the first physical set of coordinates is indicative of the first physical location 202 within layouts 210, 220, 230, 240, 250, 260, 270, 280, and 290.

It will be appreciated that a mean value is likewise determined for a resistor or other analog device at the second physical location 204, where the second physical location 204 is mapped to a second physical set of coordinates and a second array set of coordinates. Additionally, a standard deviation is able to be determined for the first physical location 202 as well as for the second physical location 204.

Figure 3:
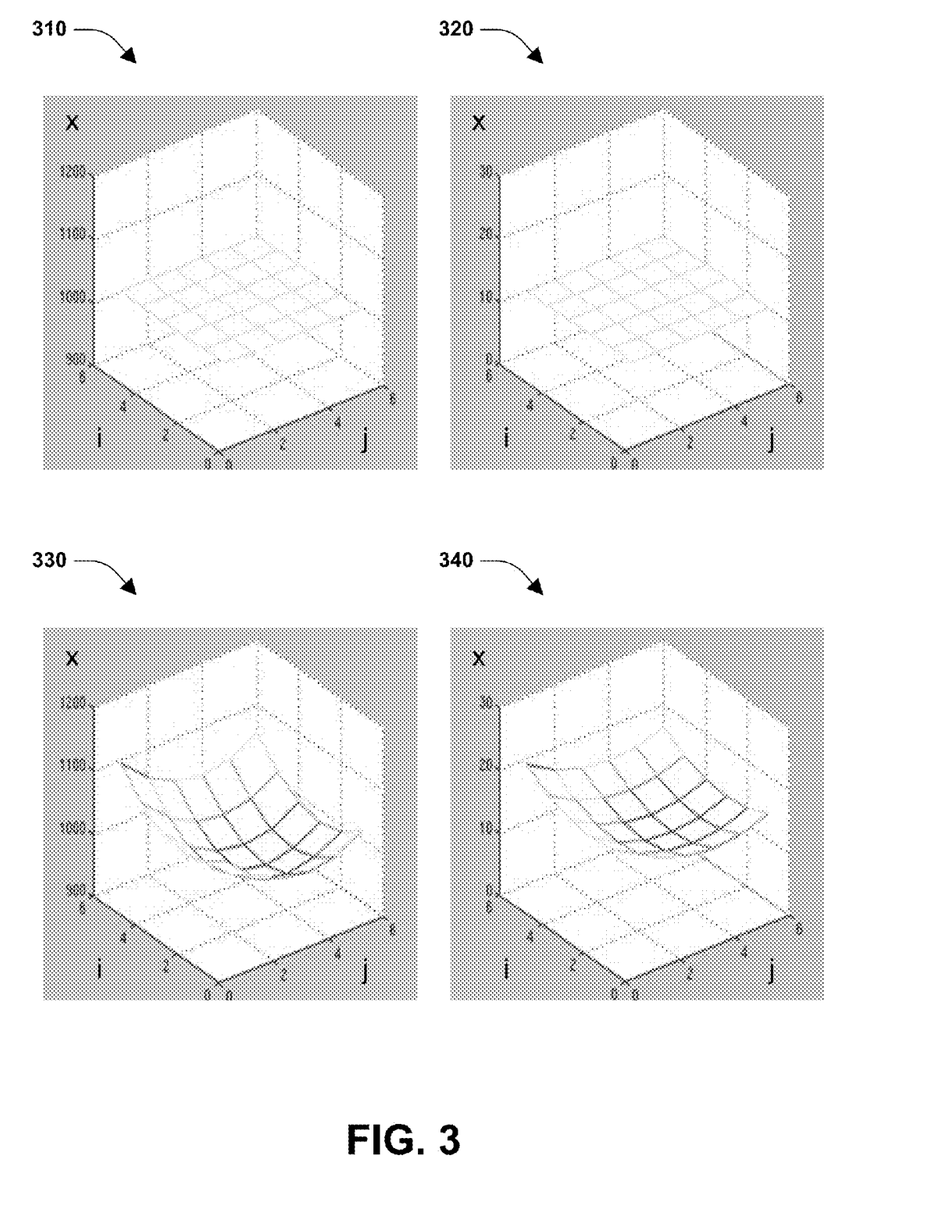
FIG. 3 is an illustration of graphs of an example array model, according to an embodiment.

FIG. 3 is an illustration of graphs of an example array model, according to an embodiment. In the graphs 310, 320, 330, and 340, the i and j axes represent locations such that i, j coordinates give rise to an array set of coordinates that correspond to a physical set of coordinates that map to a physical location of an analog device within a circuit layout, for example. Graphs 310 and 330 indicate a mean such that the x axis in graphs 310 and 330 corresponds to an analog device characteristic, such as resistance, for example. Graphs 320 and 340 indicate a standard deviation such that the x axis in graphs 320 and 340 corresponds to a degree of deviation. It is seen in graph 310 that regardless of a physical location of an analog device, as represented by a physical set of coordinates that map to an array set of coordinates i, j in graph 310, the mean value does not change. For example, regardless of the i, j array set of coordinates in graph 310, the mean or x axis value is approximately 1000. Similarly, in graph 320, regardless of the i, j array set of coordinates, the standard deviation or x axis value is approximately 10. Graphs 330 and 340, however, illustrate different values for both the mean and the standard deviation at different locations across a circuit, such as resulting from a gradient effect, for example. Accordingly, given that variations in an analog device characteristic are generally exacerbated near an edge of a circuit layout, x axis values are higher at peripheral i, j coordinates in both the mean array 320 and the standard deviation array 340. It will be appreciated that modeling the behavior of an analog device, and thus a circuit within which the analog device is comprised, using graphs 330 and 340 allows a more realistic performance of the circuit to be realized given that graphs 330 and 340 consider real world variations in an analog device characteristic of the analog device, particularly as a function of the physical location of the analog device within a circuit layout, for example.

Figure 4:
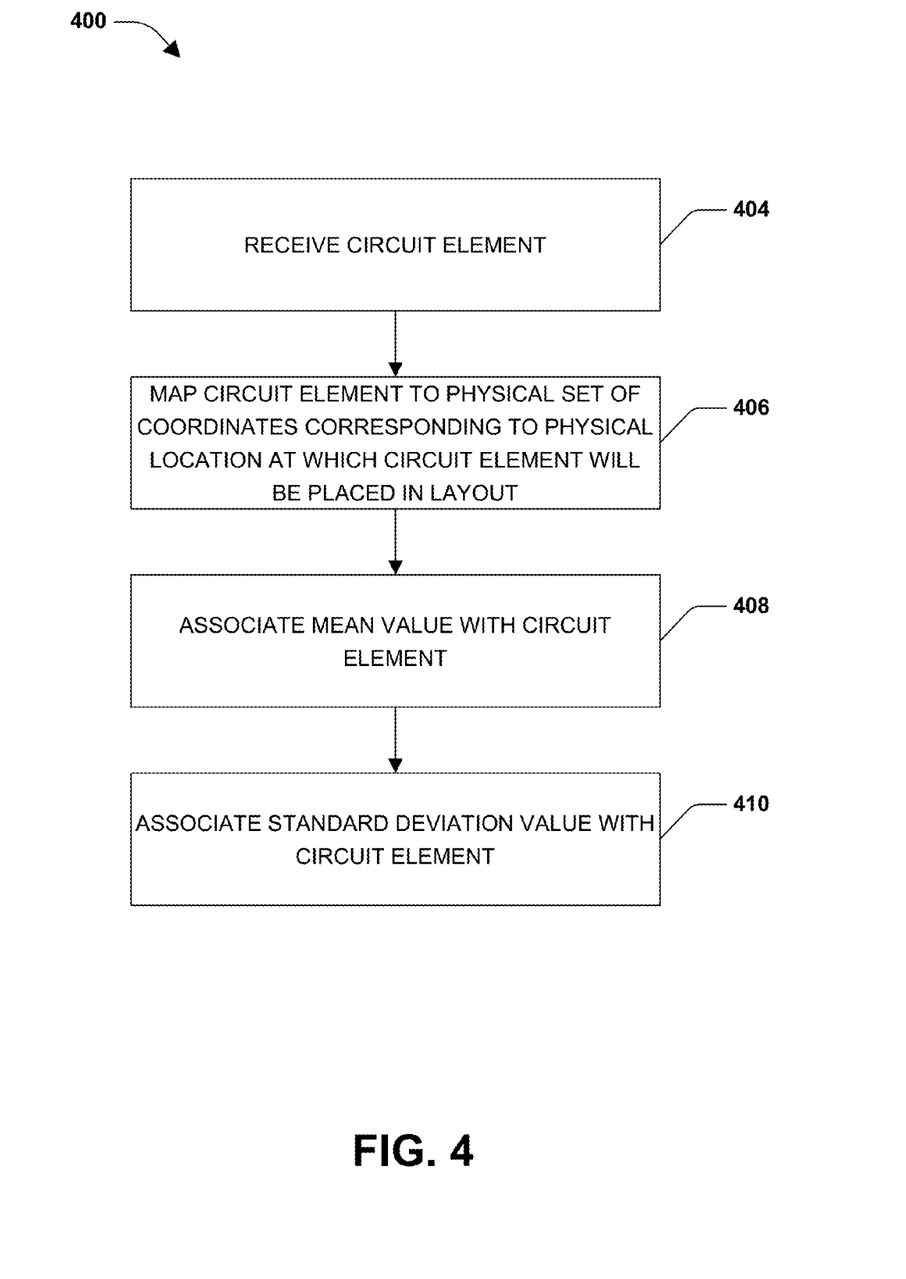
FIG. 4 is a flow diagram of an example method for associating an array model for an analog device with a circuit element of a schematic simulation, according to an embodiment.

FIG. 4 is a flow diagram of an example method 400 for associating an array model for an analog device with a circuit element of a schematic simulation, according to an embodiment. At 404, a circuit element is received. At 406, the circuit element is mapped to a physical set of coordinates corresponding to a physical location at which the circuit element will be placed in a circuit layout. For example, if the circuit element will be placed at a physical location in the circuit layout, the circuit element is mapped to a corresponding physical set of coordinates, such as (0, 0). At 408, a mean value is associated with the circuit element based on the physical set of coordinates mapping to an array set of coordinates within an array model. In an embodiment, the array set of coordinates is equal to the physical set of coordinates such that a direct mapping exists. In other words, if the physical set of coordinates is (1, 2), for example, then the array set of coordinates (1, 2), and thus a mean value at the array set of coordinates of (1, 2) is obtained. In an example, the mean value is obtained from a lookup function. In an embodiment, the mean value is indicative of a mean of an analog device characteristic for one or more analog devices at the array set of coordinates. As an example, in graph 330 of FIG. 3, the mean value is a mean resistance value, and the resistance value associated with (0, 0) of the array model is approximately 1100 ohms or 1.1 kOhm. At 410, a standard deviation value is associated with the circuit element based on the mapping of the physical set of coordinates to the array set of coordinates within the array model. In an embodiment, the standard deviation value is indicative of a standard deviation of the analog device characteristic for the one or more analog devices at the array set of coordinates. As an example, in graph 340 of FIG. 3, the standard deviation of the analog device characteristic of resistance is approximately 20 at coordinates (0, 0).

Figure 5:
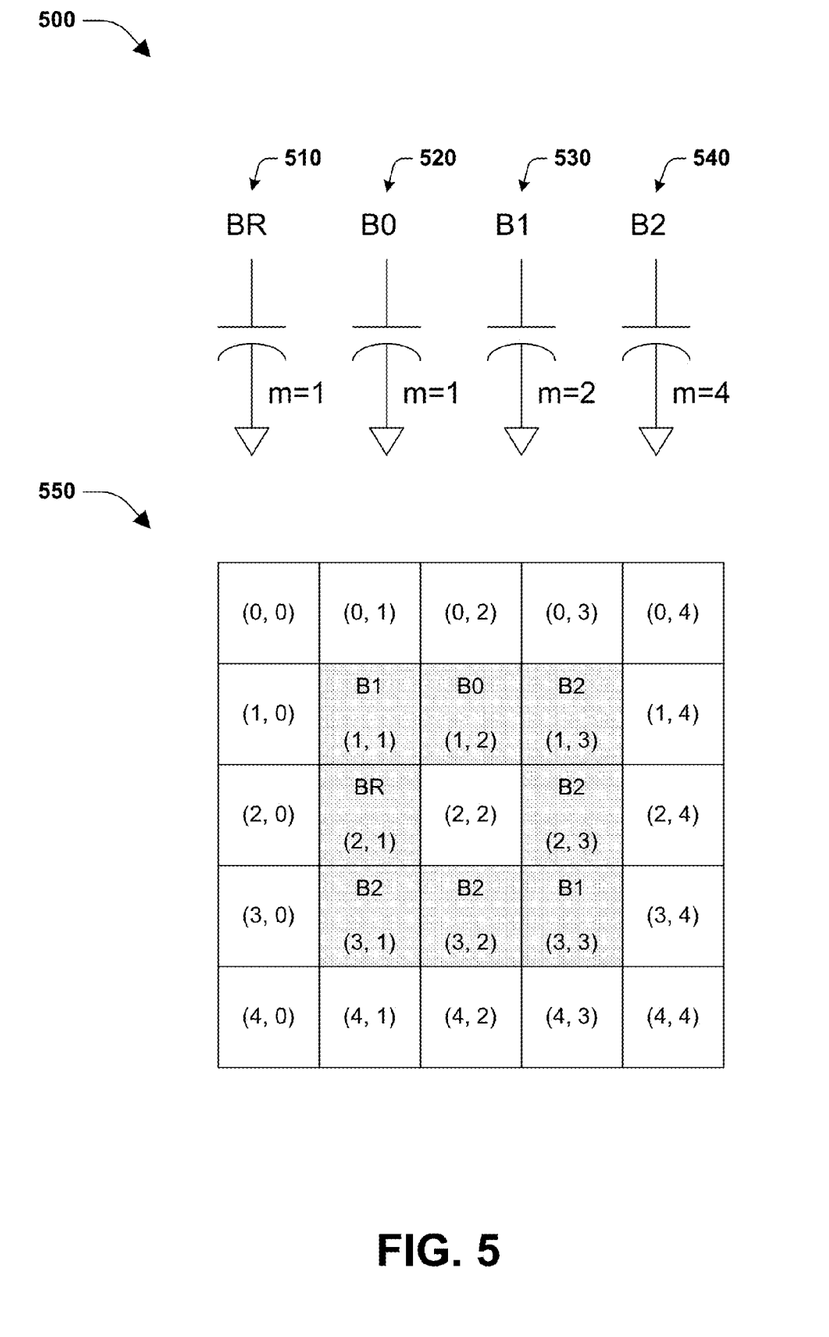
FIG. 5 is an example mapping of an array model, according to an embodiment.

FIG. 5 is an example mapping 550 of an array model, according to an embodiment. FIG. 5, for example, provides an example mapping of analog devices based on port connections to one or more cell indexes. For example, a port connection is a node or an endpoint for an analog device. As another example, a resistor generally comprises two ports or two connection points, for example. A cell index is associated with a physical location of the analog device. For example, the i, j coordinates of FIG. 3 is the cell index in an embodiment. Additionally, the i, j coordinates are associated with an array set of coordinates that correspond to a physical set of coordinates that map to a physical location of the analog device such that i and j are lookup coordinates, or an index, in other words, for an array of cells.

Circuit layout 500 shows a 3-bit capacitor array, for example. The capacitor array comprises a first capacitor 510, a second capacitor 520, a third capacitor 530, and a fourth capacitor 540. In this example, BR, B0, B1, and B2 are merely names of ports or connections for respective capacitors, and m is a multiple number associated with a count for respective capacitors. For example, the first capacitor 510 is associated with port connection BR, and has a count of m=1 in circuit layout 500. Accordingly, at the mapping 550 of the array model, there is one instance of the first capacitor 510 at port connection BR at (2, 1) at least because m=1. As another example, the fourth capacitor 540 is associated with port connection B2, and has a count of m=4 in circuit layout 500. In this example, there are four instances of the fourth capacitor 540 at port connection B2 at (1, 3), (2, 3), (3, 1), and (3, 2) at least because m=4, for example. In an embodiment, the first capacitor 510 comprises a port connection to BR, the second capacitor 520 comprises a port connection to B0, a third capacitor 530 comprises a port connection to B1, and a fourth capacitor 540 comprises a port connection to B2. In this example, BR, B0, B1, and B2 are associated with one or more cell indexes. In an embodiment, one or more ports of respective capacitors are mapped to a table of cell indexes based on an associated physical set of coordinates associated with respective cell indexes. At 550, a graphical representation of a port mapping for the array model is illustrated. In an embodiment, the array model 550 allocates port connections versus a cell index by mapping port connections into table 550. It will be appreciated that table 550 is color coded in some embodiments such that ports BR, B0, B1, and B2 are coded with differing colors, for example. In an embodiment, a circuit element is mapped to a cell index associated with the physical set of coordinates based on a physical location of the circuit element within a circuit layout. In other words, the circuit elements, such as the capacitors of FIG. 5, are mapped to a cell index based on a location at which the respective capacitors will be fabricated. In this example, array model 550 maps port connection BR of the first capacitor 510 to physical set of coordinates (2, 1). Therefore, the first capacitor 510 is associated with an array model associated with analog device characteristics for capacitors at (2, 1). In other words, since the first capacitor 510 will have a connection to (2, 1), simulation data associated with the first capacitor 510 is associated with a mean and standard deviation of an array model for that location, where the array model is built based on measurements of multiple data points or capacitors fabricated at (2, 1). Additionally, port connection B0 of the second capacitor 520 is mapped to physical set of coordinates (1, 2). Port connection B1 of the third capacitor 530 is mapped to physical sets of coordinates (1, 1) and (3, 3). In an embodiment, port connection B2 of the fourth capacitor 540 is mapped to physical sets of coordinates (1, 3), (2, 3), (3, 1), and (3, 2). In this way, the respective port connections for capacitors 510, 520, 530, and 540 are mapped to a cell index or an array set of coordinates. Therefore, the respective capacitors are modeled with mean values and standard deviation values from an array model based on the array set of coordinates associated with the respective port connections. This enables more precise modeling for the respective capacitors at least because location based tendencies, such as gradient or edge variations are accounted for during simulation. It will be appreciated that although four capacitors are illustrated, this number is merely an example. Accordingly, the instant application, including the scope of the appended claims, is not limited by this example number, as a number other than four is contemplated. Additionally, it will be appreciated that analog devices other than capacitors are contemplated. For example, an analog device is at least one of a resistor, a capacitor, an inductor, a transconductor, a conductor, a diode, a current source, a voltage source, a metal oxide semiconductor field effect transistor (MOSFET), a thin-fin field effect transistor (FinFET), a bipolar junction transistor (BJT), a varactor, etc.

Figure 6:
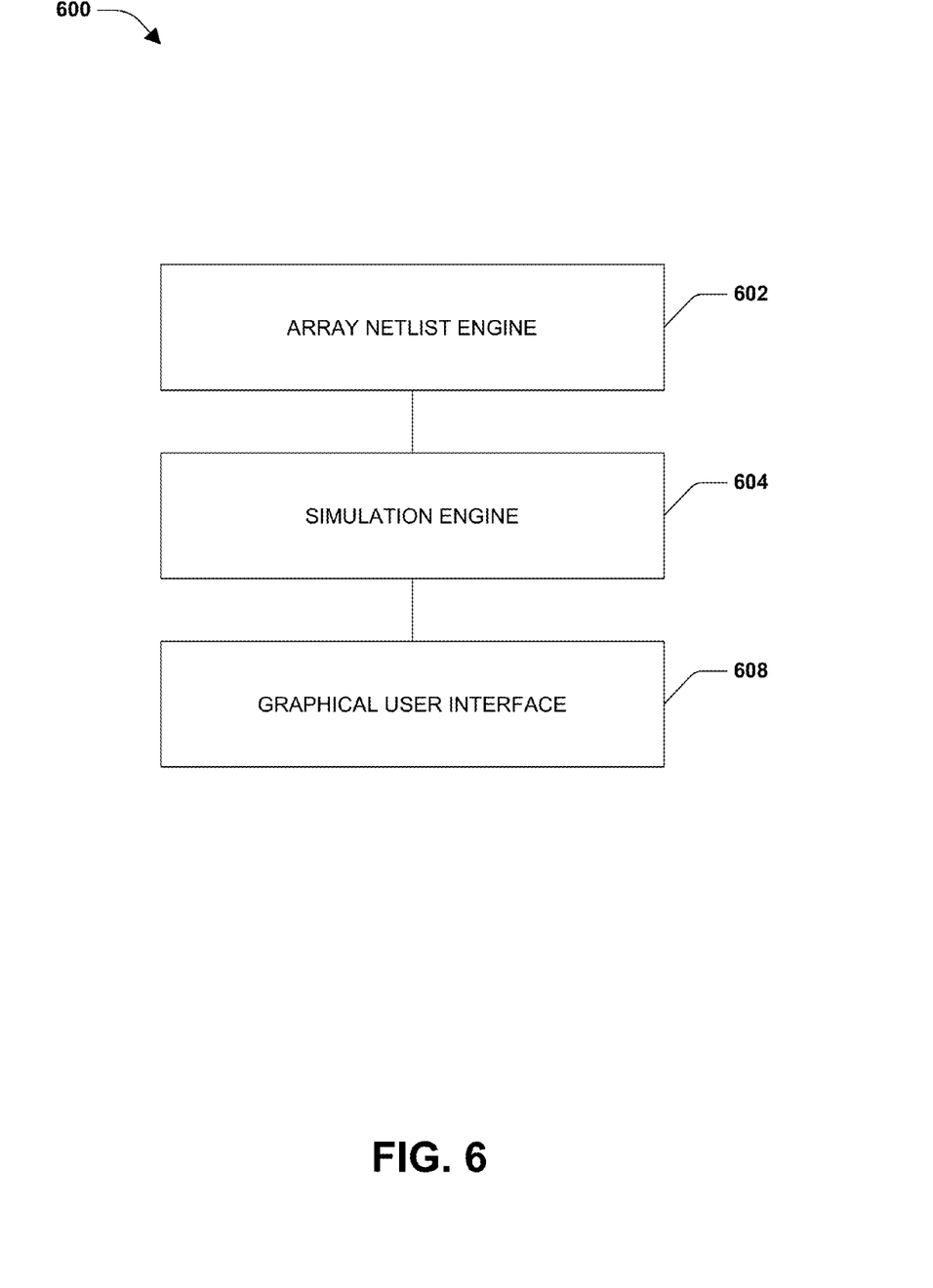
FIG. 6 is a component diagram of an example system for creating a netlist for associating an array model for an analog device with a circuit element of a schematic simulation, according to an embodiment.

FIG. 6 is a component diagram of an example system 600 for creating a netlist for associating an array model for an analog device with a circuit element of a schematic simulation, according to an embodiment. In an embodiment, the system 600 comprises an array netlist engine 602, a simulation engine 604, and a graphical user interface component (GUI) 608. In an embodiment, the array netlist engine 602 is configured to receive a circuit schematic comprising a circuit element. The circuit element is, for example, an analog device, such as a transistor, diode, varactor, MOSFET, FinFET, BJT, etc. In an embodiment, the array netlist engine 602 is configured to map the circuit element to a physical set of coordinates corresponding to a physical location at which the circuit element will be placed in a circuit layout corresponding to the circuit schematic. For example, if the circuit element is placed a physical location, the physical set of coordinates is used to identify the physical location. In an example embodiment, a Cartesian coordinate system is used, such as grid coordinates (4, 5), for example. In an embodiment, the array netlist engine 602 is configured to associate a mean value with the circuit element based on the physical set of coordinates mapping to an array set of coordinates within an array model, the mean value indicative of a mean of an analog device characteristic for one or more analog devices at the array set of coordinates. For example, if the circuit element is to be placed at (4, 5), the array netlist engine 602 determines the mean value from the array model by looking up (4, 5) in a corresponding mean value array. In an embodiment, the corresponding mean value array comprises mean values indicative of a mean of the analog device characteristic for analog devices across a range of array sets of coordinates. In an embodiment, the array netlist engine 602 is configured to associate a standard deviation value with the circuit element based on the mapping of the physical set of coordinates to the array set of coordinates within the array model. In other words, the array netlist engine 602 is configured to associate the standard deviation value with the circuit element for a location, such as a cell index or a physical location. In an embodiment, the standard deviation value is indicative of a standard deviation of the analog device characteristic for the one or more analog devices at the array set of coordinates. In an embodiment, the array netlist engine 602 is configured to map the circuit element to a cell index associated with the physical set of coordinates. In an embodiment, the array netlist engine 602 is configured to create a netlist based on the circuit element, the physical set of coordinates, the array set of coordinates, the mean value, and the standard deviation value. Accordingly, the netlist comprises cell index information, array size information, mean values, standard deviation values, and functions, for example.

In an embodiment, simulation engine 604 is configured to perform a simulation based on the netlist and the circuit element. In another embodiment, the simulation engine 604 is configured to simulate the circuit element in a schematic simulation based on the mean value and the standard deviation value associated with the circuit element. In an embodiment, the graphical user interface (GUI) component 608 is configured to generate a port mapping file, such as the array model 550 of FIG. 5, for example. In an embodiment, the GUI component 608 is configured to generate at least one of a text map, a table, an array, or a plot indicative of the array model 550 of FIG. 5, graph 330 of FIG. 3, or graph 340 of FIG. 3. In another embodiment, the GUI component 608 is configured to provide a graphical representation of at least one of the mean value or the standard deviation value plotted against at least one of the physical set of coordinates or the array set of coordinates, such as graph 330, for example. In an embodiment, graphical user interface (GUI) component 608 is configured to allow a user to manipulate the array model, such as by inputting data to the model or selecting a subset of data within the array model.

Figure 7:
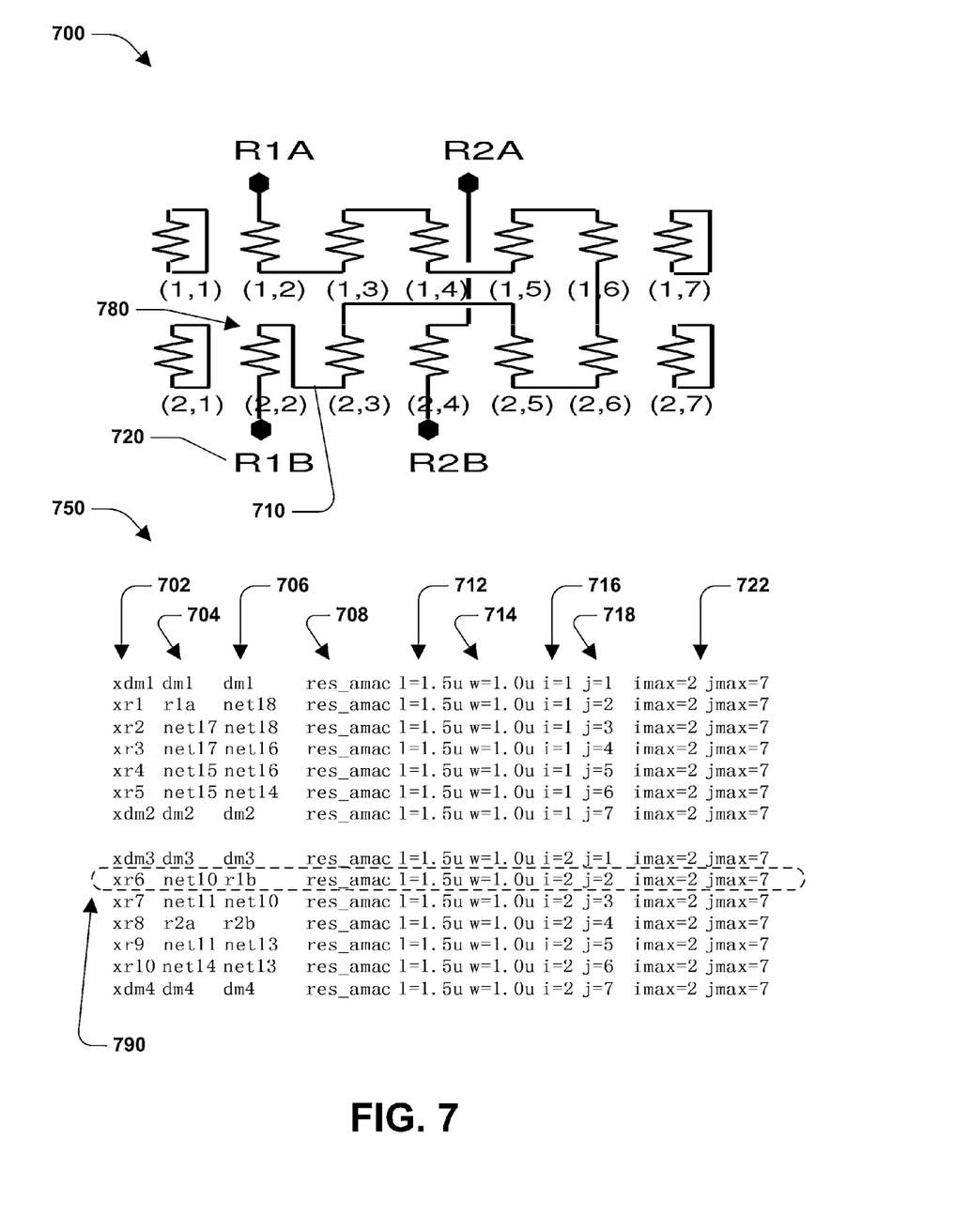
FIG. 7 is an example netlist for an array model, according to an embodiment.

FIG. 7 is an example netlist 750 for an array model, according to an embodiment. FIG. 7 illustrates an array of resistors 700 with a corresponding array set of coordinates. In an embodiment, the array set of coordinates is identical to a physical set of coordinates for the respective resistors within the array. For example, the array of resistors 700 comprises a first resistor, a second resistor, a third resistor, up to a fourteenth resistor, etc., as illustratively shown in array or resistors 700. In some embodiments, the first resistor is associated with an array set of coordinates (1,1), the second resistor is associated with an array set of coordinates (1,2), and the fourteenth resistor is associated with an array set of coordinates (2,7), etc. It will be appreciated that fourteen is merely an example number, and any number in the array 700 is contemplated. Additionally, arrays of other analog devices are contemplated, such as at least one of a resistor, a capacitor, an inductor, a transconductor, a conductor, a diode, a current source, a voltage source, a metal oxide semiconductor field effect transistor (MOSFET), a thin-fin field effect transistor (FinFET), a bipolar junction transistor (BJT), a varactor, etc. It will be appreciated that respective resistors comprise one or more port connections. For example, a ninth resistor 780 is associated with an array set of coordinates (2, 2). In some embodiments, the ninth resistor 780 comprises a first port connection to R1B 720 and a second port connection to "net10" 710, as will be described in more detail with regard to netlist 750.

FIG. 7 illustrates an example netlist 750 comprising one or more columns indicating circuit element names 702, one or more port connections 704 and 706, a device model name 708, a circuit element length 712, a circuit element width 714, an array index or array set of coordinates 'i' 716 and 'j' 718, and array size information 722. As an example, respective rows of the netlist 750 represent the fourteen resistors of the resistor array 700 at least because the netlist 750 comprises fourteen rows. For example, at row 790 in netlist 750, netlist information associated with the ninth resistor 780 is shown. In some embodiments, column 702 indicates a name of the ninth resistor 780 is xr6. Additionally, columns 704 and 706 describe port connections for the ninth resistor 780. For example, in the array of resistors 700, the ninth resistor 780 comprises a first port connection to R1B 720 and a second port connection to "net10" 710. Columns 704 and 706 of the netlist 750 mirrors these port connections with port connection net10 at column 704 and port connection r1b at column 706 of row 790. At column 708, the device model name for the ninth resistor 780 is res_amac. The circuit element length 712 and the circuit element width 714, such as a resistor length 712 and a resistor width 714 for the ninth resistor 780 are 1.5 micrometers and 1.0 micrometers, respectively. In some embodiments, columns 716 and 718 are indicative of (i, j) coordinates, for example. Accordingly, column 716 is the i coordinate and 718 is the j coordinate. In this example, the ninth resistor 780 is associated with array coordinates 'i'=2 and 'j'=2 or (2, 2), for example. At 722, array size information for the resistor array 700 is shown. For example, the resistor array 700 comprises two rows of seven resistors. Therefore, 722 indicates that imax=2 and jmax=7. In an embodiment, the array set of coordinates for the mean array within the array model are created based on a distribution function. For example, since the ninth resistor 780 is associated with coordinates (2, 2), when the ninth resistor 780 is placed in a simulation environment, a mean value from an array model associated with the (2, 2) coordinate is used, rather than a theoretical value associated with the ninth resistor 780. It will be appreciated that other rows of the netlist 750 comprise a similar format indicating circuit element names in column 702, one or more port connections at column 704 and column 706, a device model name at column 708, a circuit element length at column 712, a circuit element width at column 714, an array index or array set of coordinates 'i' at column 716 and 'j' at column 718, and array size information at column 722.

In an embodiment, a circuit comprising a circuit element is received. For example, the circuit comprises a resistor in a resistor array, such as the resistor array 700 of FIG. 7. In an example, the ninth resistor 780 of the resistor array 700 is selected. In this example, the ninth resistor 780 is associated with coordinates (2, 2) and the size of the array 700 is two by seven or (2, 7) at least because array 700 comprises two rows of seven resistors. In an embodiment, a netlist 750 is created. For example, the netlist 750 comprises a list of port connections 704 and 706 associated with circuit elements of the circuit, such as the fourteen resistors of resistor array 700. In this way, more accurate simulation is facilitated by the netlist 750 at least because the netlist 750 comprises array coordinates at column 716 and column 718 or physical coordinates associated with analog devices of column 702 of an array of analog devices, such as resistor array 700. For example, an analog device characteristic of the analog device is modeled based on an array coordinates of column 716 and column 718. In an embodiment, a design rule check is executed on at least one of the netlist 750, a port mapping file, or an associated array model, such as the array model of FIG. 5, for example.

Figure 8:
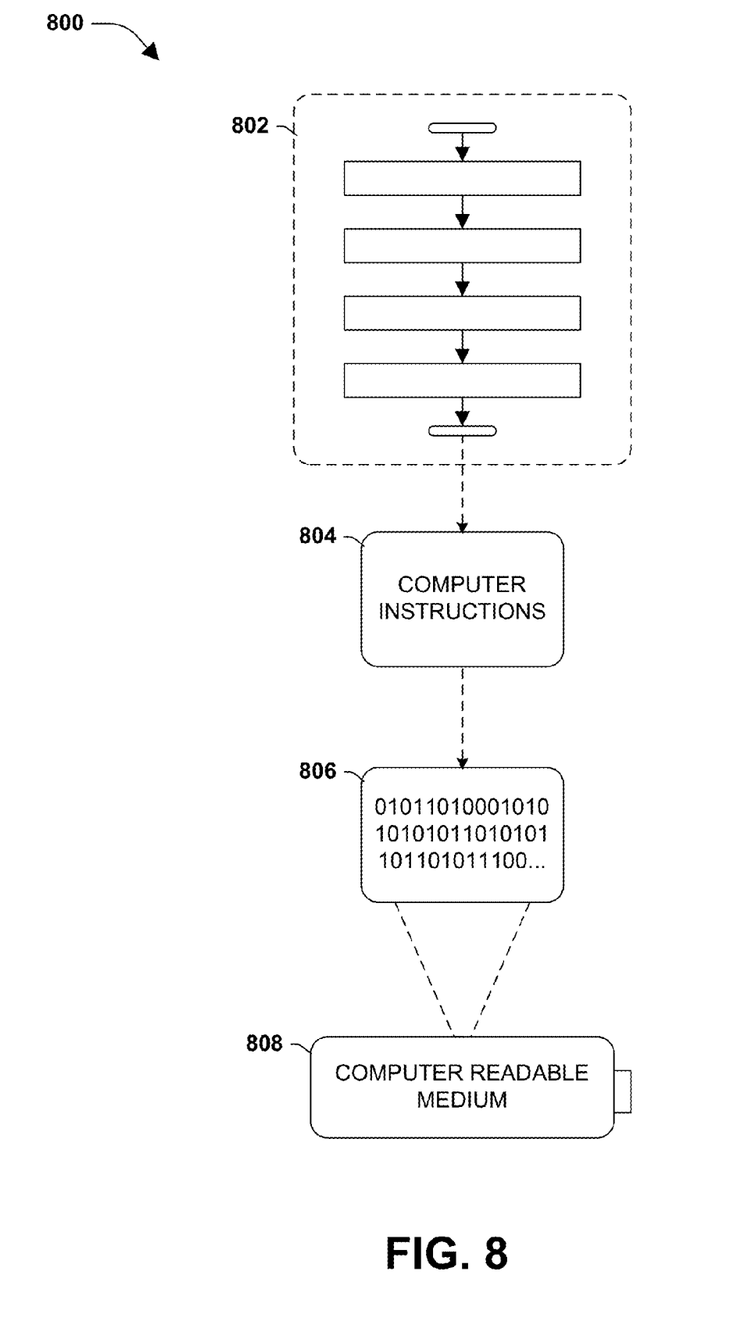
FIG. 8 is an illustration of an example computer-readable medium or computer-readable device comprising processor-executable instructions configured to embody one or more of the provisions set forth herein, according to an embodiment.

Still another embodiment involves a computer-readable medium comprising processor-executable instructions configured to implement one or more of the techniques presented herein. An example embodiment of a computer-readable medium or a computer-readable device that is devised in these ways is illustrated in FIG. 8, wherein the implementation 800 comprises a computer-readable medium 808, such as a CD-R, DVD-R, flash drive, a platter of a hard disk drive, etc., on which is encoded computer-readable data 806. This computer-readable data 806, such as binary data comprising a plurality of zero's and one's as shown in 806, in turn comprises a set of computer instructions 804 configured to operate according to one or more of the principles set forth herein. In one such embodiment 800, the processor-executable computer instructions 804 is configured to perform a method 802, such as at least some of the exemplary method 100 of FIG. 1 or at least some of exemplary method 400 of FIG. 4, for example. In another embodiment, the processor-executable instructions 804 are configured to implement a system, such as at least some of the exemplary system 600 of FIG. 6, for example. Many such computer-readable media are devised by those of ordinary skill in the art that are configured to operate in accordance with the techniques presented herein.

Although the subject matter has been described in language specific to structural features or methodological acts, it is to be understood that the subject matter defined in the appended claims is not necessarily limited to the specific features or acts described above. Rather, the specific features and acts described above are disclosed as example forms of implementing the claims.

As used in this application, the terms "component", "module," "system", "interface", and the like are generally intended to refer to a computer-related entity, either hardware, a combination of hardware and software, software, or software in execution. For example, a component may be, but is not limited to being, a process running on a processor, a processor, an object, an executable, a thread of execution, a program, or a computer. By way of illustration, both an application running on a controller and the controller can be a component. One or more components residing within a process or thread of execution and a component may be localized on one computer or distributed between two or more computers.

Furthermore, the claimed subject matter is implemented as a method, apparatus, or article of manufacture using standard programming or engineering techniques to produce software, firmware, hardware, or any combination thereof to control a computer to implement the disclosed subject matter. The term "article of manufacture" as used herein is intended to encompass a computer program accessible from any computer-readable device, carrier, or media. Of course, many modifications may be made to this configuration without departing from the scope or spirit of the claimed subject matter.

Figure 9:
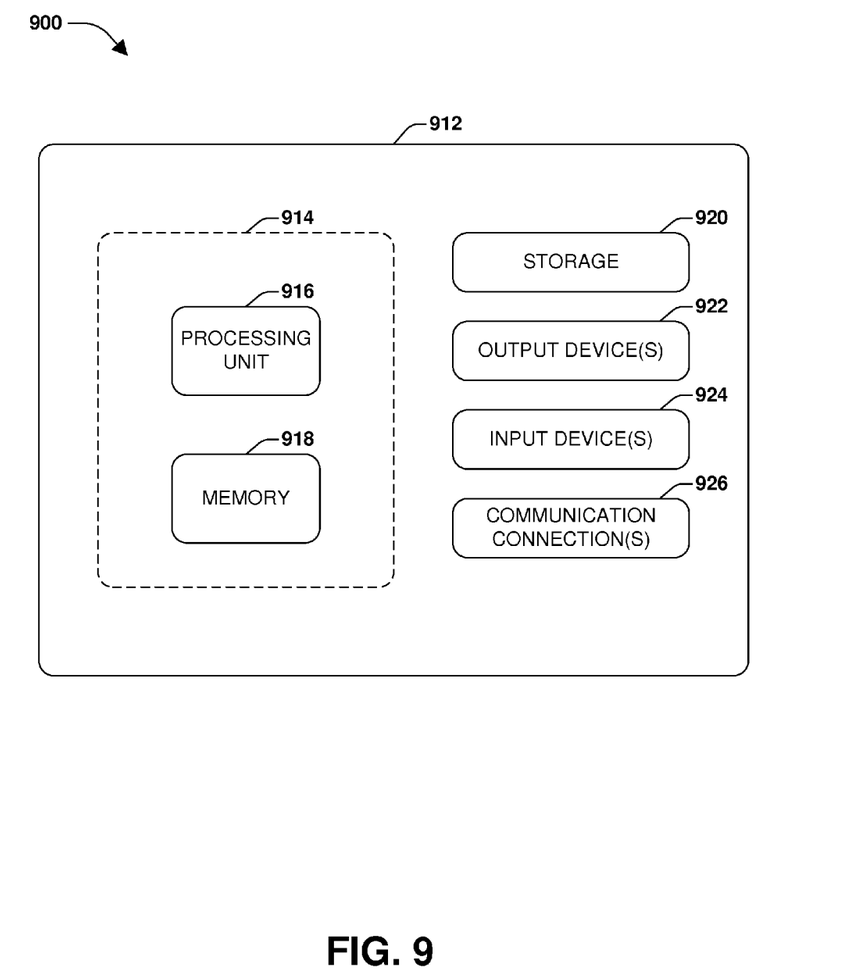
FIG. 9 is an illustration of an example computing environment where one or more of the provisions set forth herein are implemented, according to an embodiment.

FIG. 9 and the following discussion provide a brief, general description of a suitable computing environment to implement embodiments of one or more of the provisions set forth herein. The operating environment of FIG. 9 is only one example of a suitable operating environment and is not intended to suggest any limitation as to the scope of use or functionality of the operating environment. Example computing devices include, but are not limited to, personal computers, server computers, hand-held or laptop devices, mobile devices, such as mobile phones, Personal Digital Assistants (PDAs), media players, and the like, multiprocessor systems, consumer electronics, mini computers, mainframe computers, distributed computing environments that include any of the above systems or devices, and the like.

Generally, embodiments are described in the general context of "computer readable instructions" being executed by one or more computing devices. Computer readable instructions are distributed via computer readable media as will be discussed below. Computer readable instructions are implemented as program modules, such as functions, objects, Application Programming Interfaces (APIs), data structures, and the like, that perform particular tasks or implement particular abstract data types. Typically, the functionality of the computer readable instructions are combined or distributed as desired in various environments.

FIG. 9 illustrates an example of a system 900 comprising a computing device 912 configured to implement one or more embodiments provided herein. In one configuration, computing device 912 includes at least one processing unit 916 and memory 918. Depending on the exact configuration and type of computing device, memory 918 may be volatile, such as RAM, non-volatile, such as ROM, flash memory, etc., or some combination of the two. This configuration is illustrated in FIG. 9 by dashed line 914.

In other embodiments, device 912 includes additional features or functionality. For example, device 912 also includes additional storage such as removable storage or non-removable storage, including, but not limited to, magnetic storage, optical storage, and the like. Such additional storage is illustrated in FIG. 9 by storage 920. In an embodiment, computer readable instructions to implement one or more embodiments provided herein are in storage 920. Storage 920 also stores other computer readable instructions to implement an operating system, an application program, and the like. Computer readable instructions are loaded in memory 918 for execution by processing unit 916, for example.

The term "computer readable media" as used herein includes computer storage media. Computer storage media includes volatile and nonvolatile, removable and non-removable media implemented in any method or technology for storage of information such as computer readable instructions or other data. Memory 918 and storage 920 are examples of computer storage media. Computer storage media includes, but is not limited to, RAM, ROM, EEPROM, flash memory or other memory technology, CD-ROM, Digital Versatile Disks (DVDs) or other optical storage, magnetic cassettes, magnetic tape, magnetic disk storage or other magnetic storage devices, or any other medium which can be used to store the desired information and which can be accessed by device 912. Any such computer storage media is part of device 912.

The term "computer readable media" includes communication media. Communication media typically embodies computer readable instructions or other data in a "modulated data signal" such as a carrier wave or other transport mechanism and includes any information delivery media. The term "modulated data signal" includes a signal that has one or more of its characteristics set or changed in such a manner as to encode information in the signal.

Device 912 includes input device(s) 924 such as keyboard, mouse, pen, voice input device, touch input device, infrared cameras, video input devices, or any other input device. Output device(s) 922 such as one or more displays, speakers, printers, or any other output device are also included in device 912. Input device(s) 924 and output device(s) 922 are connected to device 912 via a wired connection, wireless connection, or any combination thereof. In an embodiment, an input device or an output device from another computing device are used as input device(s) 924 or output device(s) 922 for computing device 912. Device 912 also includes communication connection(s) 926 to facilitate communications with one or more other devices.

According to an aspect, a method for creating an array model for analog device modeling is provided, comprising creating a mean array comprising one or more mean elements. In an embodiment, a mean element of the one or more mean elements of the mean array is associated with an array set of coordinates within an array model, the mean element comprising a mean value indicative of a mean of an analog device characteristic for one or more analog devices at a physical set of coordinates mapped from the array set of coordinates, the physical set of coordinates indicative of a physical location of the one or more analog devices within a circuit layout. The method comprises creating a standard deviation array comprising one or more standard deviation elements. In an embodiment, a standard deviation element of the one or more standard deviation elements of the standard deviation array is associated with the array set of coordinates within the array model, the standard deviation element comprising a standard deviation value indicative of a standard deviation of the analog device characteristic for the one or more analog devices at the physical set of coordinates. The method comprises creating the array model based on the mean array and the standard deviation array.

According to an aspect, a computer-readable storage medium, such as a non-transitory computer-readable storage medium, comprising computer-executable instructions, which when executed via a processing unit on a computer perform a method for associating an array model for an analog device with a circuit element of a schematic simulation. In an embodiment, a circuit element is received and mapped to a physical set of coordinates corresponding to a physical location at which the circuit element will be placed in a circuit layout. In an embodiment, a mean value is associated with the circuit element based on the physical set of coordinates mapping to an array set of coordinates within an array model. In an embodiment, the mean value is indicative of a mean of an analog device characteristic for one or more analog devices at the array set of coordinates. In an embodiment, a standard deviation value is associated with the circuit element based on the mapping of the physical set of coordinates to the array set of coordinates within the array model. In an embodiment, the standard deviation value is indicative of a standard deviation of the analog device characteristic for the one or more analog devices at the array set of coordinates.

According to an aspect, a system for creating a netlist for associating an array model for an analog device with a circuit element of a schematic simulation is provided, comprising an array netlist engine configured to receive a circuit schematic comprising a circuit element of a semiconductor device. In an embodiment, the array netlist engine is configured to map the circuit element to a physical set of coordinates corresponding to a physical location at which the circuit element will be placed in a circuit layout. In an embodiment, the array netlist engine is configured to associate a mean value with the circuit element based on the physical set of coordinates mapping to an array set of coordinates within an array model, the mean value indicative of a mean of an analog device characteristic for one or more analog devices at the array set of coordinates. In an embodiment, the array netlist engine is configured to associate a standard deviation value with the circuit element based on the mapping of the physical set of coordinates to the array set of coordinates within the array model, the standard deviation value indicative of a standard deviation of the analog device characteristic for the one or more analog devices at the array set of coordinates. In an embodiment, the array netlist engine is configured to create a netlist based on at least one of the circuit element, the physical set of coordinates, the array set of coordinates, the mean value, and the standard deviation value.

Although the subject matter has been described in language specific to structural features or methodological acts, it is to be understood that the subject matter of the appended claims is not necessarily limited to the specific features or acts described above. Rather, the specific features and acts described above are disclosed as example forms of implementing the claims.

Various operations of embodiments are provided herein. The order in which some or all of the operations are described should not be construed as to imply that these operations are necessarily order dependent. Alternative ordering will be appreciated based upon this description. Further, it will be understood that not all operations are necessarily present in each embodiment provided herein.

Moreover, "exemplary" is used herein to mean serving as an example, instance, illustration, etc., and not necessarily as advantageous. As used in this application, "or" is intended to mean an inclusive "or" rather than an exclusive "or". In addition, "a" and "an" as used in this application are generally be construed to mean "one or more" unless specified otherwise or clear from context to be directed to a singular form. Also, at least one of A and B and/or the like generally means A or B or both A and B. Furthermore, to the extent that "includes", "having", "has", "with", or variants thereof are used in either the detailed description or the claims, such terms are intended to be inclusive in a manner similar to the term "comprising".

Also, although the disclosure has been shown and described with respect to one or more implementations, equivalent alterations and modifications will occur based upon a reading and understanding of this specification and the annexed drawings. The disclosure includes all such modifications and alterations and is limited only by the scope of the following claims.

What is claimed is:

1. A method for creating an array model for analog device modeling, comprising:
    creating a mean array, wherein:
        a first axis of the mean array represents mean values,
        a second axis of the mean array represents a first dimension within a circuit layout containing an analog device,
        a third axis of the mean array represents a second dimension within the circuit layout containing the analog device,
        the mean array describes how a mean of an analog device characteristic of the analog device varies across the circuit layout as a function of a physical location of the analog device within the circuit layout, and
        the mean array comprises two or more mean elements, wherein:
            a first mean element of the two or more mean elements is associated with a first array set of coordinates mapped to a first physical location within the circuit layout, the first physical location having a first coordinate value for the first dimension and a second coordinate value for the second dimension;
            the first mean element comprises a first mean value of the analog device characteristic, the first mean value calculated based upon at least one of a simulated or a measured analog device characteristic for one or more analog devices disposed at the first physical location;
            a second mean element of the two or more mean elements is associated with a second array set of coordinates mapped to a second physical location within the circuit layout, the second physical location having a third coordinate value for the first dimension and a fourth coordinate value for the second dimension; and
            the second mean element comprises a second mean value of the analog device characteristic, the second mean value calculated based upon at least one of the simulated or the measured analog device characteristic for one or more analog devices disposed at the second physical location;
    creating a standard deviation array comprising one or more standard deviation elements, a standard deviation element of the one or more standard deviation elements associated with the first array set of coordinates, the standard deviation element comprising a standard deviation value indicative of a standard deviation of at least one of the simulated or the measured analog device characteristic for the one or more analog devices disposed at the first physical location;
    creating, via a processing unit, the array model based on the mean array and the standard deviation array; and
    creating a netlist for a test circuit layout corresponding to the circuit layout based upon at least one of a mean value for a circuit element of the test circuit layout derived from the array model or a standard deviation value for the circuit element of the test circuit layout derived from the array model.

2. The method of claim 1, comprising:
    creating a mean graph based on the mean array; and
    creating a standard deviation graph based on the standard deviation array.

3. The method of claim 1, creating the mean array comprising determining an array size for the array model.

4. The method of claim 1, creating the mean array comprising creating the first array set of coordinates within the array model based on a distribution function.

5. The method of claim 1, comprising:
    receiving a circuit schematic comprising the circuit element; and
    mapping the circuit element to a physical location to create the test circuit layout.

6. The method of claim 1, the analog device characteristic comprising at least one of a resistance, a capacitance, an inductance, a transconductance, a conductance, a diode model, a current scale, a metal oxide semiconductor field effect transistor (MOSFET) characteristic, a field effect transistor (FET) characteristic, a bipolar junction transistor (BJT) characteristic, a varactor characteristic, or a diode characteristic.

7. The method of claim 1, the first mean value different than the second mean value.

8. A non-transitory computer-readable storage medium comprising computer-executable instructions, which when executed via a processing unit on a computer perform a method for associating an array model for an analog device with a circuit element of a schematic simulation, comprising:
    receiving the circuit element;
    using the array model to determine a mean value and a standard deviation value for the circuit element at a physical location within a test circuit layout of the schematic simulation, wherein:
        the array model comprises a mean array and a standard deviation array,
        a first axis of the mean array represents mean values, a second axis of the mean array represents a first dimension within a circuit layout containing the analog device, a third axis of the mean array represents a second dimension within the circuit layout containing the analog device, the mean array describes how a mean of an analog device characteristic of the analog device varies across the circuit layout as a function of a physical location of the analog device within the circuit layout, the mean array comprises two or more mean elements, wherein:

a first mean element of the two or more mean elements is associated with a first array set of coordinates mapped to a first physical location within the circuit layout, the first physical location having a first coordinate value for the first dimension and a second coordinate value for the second dimension;

the first mean element comprises a first mean value of the analog device characteristic, the first mean value calculated based upon at least one of a simulated or a measured analog device characteristic for one or more analog devices disposed at the first physical location;

a second mean element of the two or more mean elements is associated with a second array set of coordinates mapped to a second physical location within the circuit layout, the second physical location having a third coordinate value for the first dimension and a fourth coordinate value for the second dimension; and the second mean element comprises a second mean value of the analog device characteristic, the second mean value calculated based upon at least one of the simulated or the measured analog device characteristic for one or more analog devices disposed at the second physical location, and the standard deviation array comprises one or more standard deviation elements, a standard deviation element of the one or more standard deviation elements associated with the first array set of coordinates, the standard deviation element comprising a standard deviation value indicative of a standard deviation of at least one of the simulated or the measured analog device characteristic for the one or more analog devices disposed at the first physical location; and creating a netlist for the test circuit layout based on at least one of the mean value or the standard deviation value for the circuit element.

9. The non-transitory computer-readable storage medium of claim 8, the netlist comprising the first array set of coordinates.

10. The non-transitory computer-readable storage medium of claim 8, comprising mapping one or more ports of the circuit element to a table.

11. The non-transitory computer-readable storage medium of claim 8, comprising simulating the circuit element in the schematic simulation based on the mean value and the standard deviation value.

12. The non-transitory computer-readable storage medium of claim 8, the analog device characteristic comprising at least one of a resistance, a capacitance, an inductance, a transconductance, a conductance, a diode model, a current scale, a metal oxide semiconductor field effect transistor (MOSFET) characteristic, a field effect transistor (FET) characteristic, a bipolar junction transistor (BJT) characteristic, a varactor characteristic, or a diode characteristic.

13. The non-transitory computer-readable storage medium of claim 8, comprising providing a graphical representation of at least one of the mean value or the standard deviation value plotted against the first array set of coordinates.

14. The non-transitory computer-readable storage medium of claim 8, comprising mapping the circuit element to a cell index.

15. A system for associating an array model for an analog device with a circuit element of a schematic simulation, comprising:

a processing unit; and memory comprising instructions that when executed by the processing unit perform operations, the operations comprising:

receiving the circuit element;

using the array model to determine a mean value and a standard deviation value for the circuit element at a physical location within a test circuit layout of the schematic simulation, wherein:

the array model comprises a mean array and a standard deviation array, a first axis of the mean array represents mean values, a second axis of the mean array represents a first dimension within a circuit layout containing the analog device, a third axis of the mean array represents a second dimension within the circuit layout containing the analog device, the mean array describes how a mean of an analog device characteristic of the analog device varies across the circuit layout as a function of a physical location of the analog device within the circuit layout, the mean array comprises two or more mean elements, wherein:

a first mean element of the two or more mean elements is associated with a first array set of coordinates mapped to a first physical location within the circuit layout, the first physical location having a first coordinate value for the first dimension and a second coordinate value for the second dimension;

the first mean element comprises a first mean value of the analog device characteristic, the first mean value calculated based upon at least one of a simulated or a measured analog device characteristic for one or more analog devices disposed at the first physical location;

a second mean element of the two or more mean elements is associated with a second array set of coordinates mapped to a second physical location within the circuit layout, the second physical location having a third coordinate value for the first dimension and a fourth coordinate value for the second dimension; and the second mean element comprises a second mean value of the analog device characteristic, the second mean value calculated based upon at least one of the simulated or the measured analog device characteristic for one or more analog devices disposed at the second physical location, and the standard deviation array comprises one or more standard deviation elements, a standard deviation element of the one or more standard deviation elements associated with the first array set of coordinates, the standard deviation element comprising a standard deviation value indicative of a standard deviation of at least one of the simulated or the measured analog device characteristic for the one or more analog devices disposed at the first physical location; and creating a netlist for the test circuit layout based on at least one of the mean value or the standard deviation value for the circuit element.

16. The system of claim 15, the operations comprising simulating the circuit element in the schematic simulation based on the mean value and the standard deviation value.

17. The system of claim 15, the operations comprising providing a graphical user interface (GUI) corresponding to the array model to allow a user to manipulate the array model.

18. The system of claim 15, the operations comprising mapping the circuit element to a cell index.

19. The system of claim 15, the operations comprising mapping one or more ports of the circuit element to a table.

20. The system of claim 15, the first mean value different than the second mean value.

* * * * *